(12) United States Patent
Kenny et al.

(10) Patent No.: US 7,104,130 B2
(45) Date of Patent: Sep. 12, 2006

(54) ULTRA-MINIATURE ACCELEROMETERS

(75) Inventors: Thomas W. Kenny, San Carlos, CA (US); Woo-Tae Park, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 10/821,757

(22) Filed: Apr. 9, 2004

(65) Prior Publication Data

US 2004/0200281 A1   Oct. 14, 2004

Related U.S. Application Data

(60) Provisional application No. 60/462,510, filed on Apr. 11, 2003.

(51) Int. Cl.
    *G01P 15/12*   (2006.01)
    *A61N 1/08*    (2006.01)
    *H04R 25/00*   (2006.01)
    *A61F 2/18*    (2006.01)

(52) U.S. Cl. .............. 73/514.33; 607/57; 600/25; 623/10

(58) Field of Classification Search ........... 73/514.33; 607/57; 600/25, 552, 559; 623/10
    See application file for complete search history.

(56) References Cited

U.S. PATENT DOCUMENTS 5,103,667 A * 4/1992 Allen et al. ............. 73/1.38
5,531,787 A * 7/1996 Lesinski et al. .......... 623/10
5,683,591 A   11/1997 Offenberg ................ 216/2
6,193,645 B1  2/2001 Kennedy ................. 600/25
6,238,580 B1  5/2001 Cole et al. .............. 216/2
6,264,603 B1  7/2001 Kennedy ................. 600/25
6,389,899 B1* 5/2002 Partridge et al. ........ 73/514.33
6,534,413 B1  3/2003 Robertson, III et al. .... 438/706
6,679,995 B1  1/2004 Banjac et al. ............ 216/2

OTHER PUBLICATIONS

Aaron Partridge et al., "New Thin Film Epitaxial Polysilicon Encapsulation For Piezoresistive Accelerometers," Proceedings 2001 IEEE Int'l. Conference on MicroElectromechanical Systems, p. 54-59.

Woo-Tae Park et al., "Wafer-Scale Film Encapsulation Of Micromachined Accelerometers," IEEE Proceedings Transducers, Jun. 2003.

Aaron Partridge et al., "A High-Performance Planar Piezoresistive Accelerometer," Journal of Microelectromechanical Systems, vol. 9, No. 1, Mar. 2000, pp. 58-66.

* cited by examiner

*Primary Examiner*—Helen Kwok
(74) *Attorney, Agent, or Firm*—Lumen Intellectual Property Services, Inc (57) ABSTRACT

A miniaturized micromachined (MEMS) accelerometer-based sensor suitable for use in biological applications, such as a middle ear implant, is provided. An encapsulation layer is deposited on top of an accelerometer proof mass and flexure prior to release of the proof mass and flexure. The encapsulation layer protects the proof mass and flexure from subsequent processing steps, such as dicing and packaging, which enables fabrication of finished devices having reduced size. Surfaces within the accelerometer may be passivated after releasing the proof mass and flexure. Remote piezoresistive sensing is performed in order to provide low noise and reduced sensor head size.

17 Claims, 10 Drawing Sheets

ULTRA-MINIATURE ACCELEROMETERS

CROSS REFERENCE TO RELATED APPLICATIONS

This application is related to and claims priority from U.S. provisional application 60/462,510 filed on Apr. 11, 2003, hereby incorporated by reference.

FIELD OF THE INVENTION

This invention relates to miniaturized micromachined accelerometers, especially as applied to biological implants.

BACKGROUND

Figure 1:
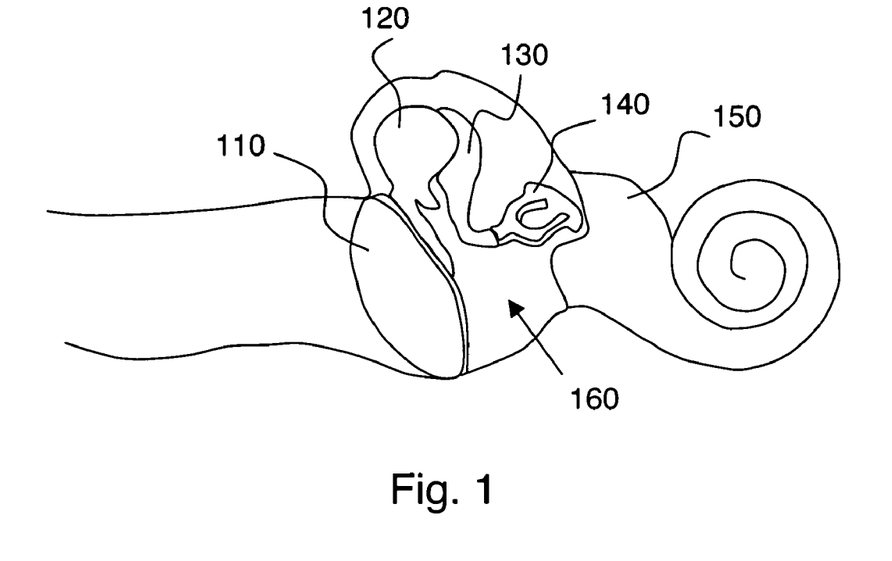
FIG. 1 shows features of a normal middle ear.
Figure 2:
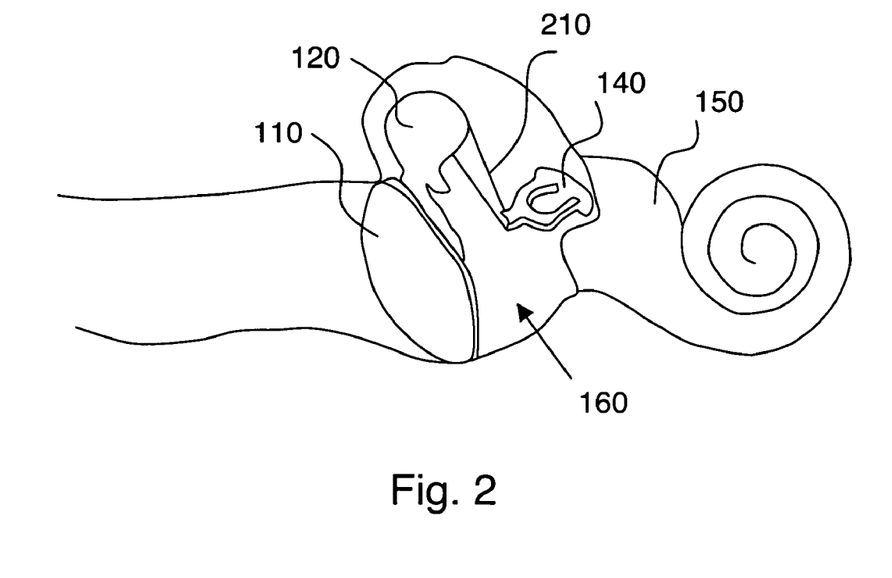
FIG. 2 shows an incus replacement in a middle ear.

Several common causes of hearing loss primarily affect the middle ear, but do not significantly affect the inner ear. Such hearing loss is referred to as conductive hearing loss, since transmission of sound to the inner ear is obstructed. Mechanisms for conductive hearing loss include: middle ear infections, excess fluid in the middle ear, eardrum damage due to infection or injury, otosclerosis of the middle ear bones, and rheumatoid arthritis. One approach for treating such conditions is to provide a middle ear implant to restore the functionality of a normal middle ear. In a normal middle ear 160, as shown on FIG. 1, acoustic vibrations set the tympanic membrane 110 into motion, and this motion is mechanically transmitted in succession through the malleus 120, incus 130 and stapes 140 before being received by the cochlea 150 of the inner ear. The malleus, incus and stapes are the ossicular bones of the middle ear. The functionality provided by the middle ear is sensing vibration of the tympanic membrane, and providing an acoustic input to the cochlea. A middle ear implant can provide this functionality with a purely mechanical linkage. For example, FIG. 2 shows an incus replacement 210 connecting malleus 120 to stapes 140.

Figure 3:
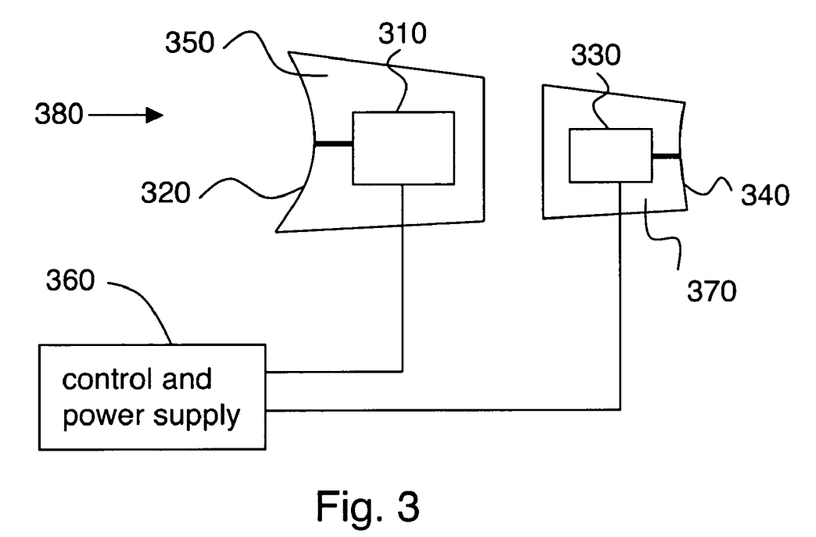
FIG. 3 shows a middle ear implant having a sensor and an actuator.

Alternatively, as shown in FIG. 3, a middle ear implant 380 can sense vibration of the tympanic membrane with a sensor 310 and provide an acoustic input to the cochlea with an actuator 330 driven by a control and power supply circuit 360 responsive to sensor 310. Circuit 360 is disposed outside the middle ear. In the example of FIG. 3, implant 380 includes a sensor package 350 and a separate actuator package 370. Surface 320 of sensor package 350 is configured to make contact with malleus 120, and surface 340 of actuator package 370 is configured to make contact with stapes 140. The approach of FIG. 3 can provide increased flexibility and/or improved implant performance compared to the approach of FIG. 2. Although FIG. 3 shows a mechanical actuator 330, an electrical actuator for providing direct electrical stimulation of the inner ear can also be used. Such an electrical actuator can have electrodes in contact with the cochlea and be driven by circuitry 360. Electrical actuation is the approach taken in several currently available implants. In either case, sensor 310 within sensor package 350 is configured for implantation into the middle ear. As a result, sensor 310 and sensor package 350 face stringent size requirements, which severely limit the available options for sensor 310.

For example, a micromachined (MEMS) accelerometer is an attractive choice for sensor 310 in terms of cost and performance, but presently available MEMS accelerometers are too large to be used as sensor 310 in middle ear implant 350 of FIG. 3. The smallest present-day MEMS accelerometers typically have length, width and height all larger than 1 mm, which is too large for such middle ear implant applications. A middle ear implant system must have dimensions less than about 1 mm×1 mm×4 mm, and within such an implant system, the dimensions taken up by an accelerometer sensor should be about 0.5 mm×0.5 mm×1 mm or less. More preferably, such an accelerometer is packaged in a package having a largest linear dimension less than about 0.5 mm. In some cases, it can be desirable to employ multiple accelerometers (e.g., if different accelerometers are tuned for operation in different frequency ranges), and in such cases, the total volume of all accelerometers should also be about 0.5 mm×0.5 mm×1 mm or less. Accordingly, it would be an advance in the art to provide a MEMS accelerometer that is small enough for use in a middle ear implant.

SUMMARY

The present invention provides miniaturized micromachined (MEMS) accelerometer-based sensors suitable for use in biological applications, such as a middle ear implant. An encapsulation layer is deposited on top of an accelerometer proof mass and flexure prior to release of the proof mass and flexure. The encapsulation layer protects the proof mass and flexure from subsequent processing steps, such as dicing and packaging, which enables fabrication of finished devices having reduced size. Preferably, surfaces within the accelerometer are passivated after releasing the proof mass and flexure. Remote piezoresistive sensing is performed in order to provide low noise and reduced sensor head size.

DETAILED DESCRIPTION

Figure 4:
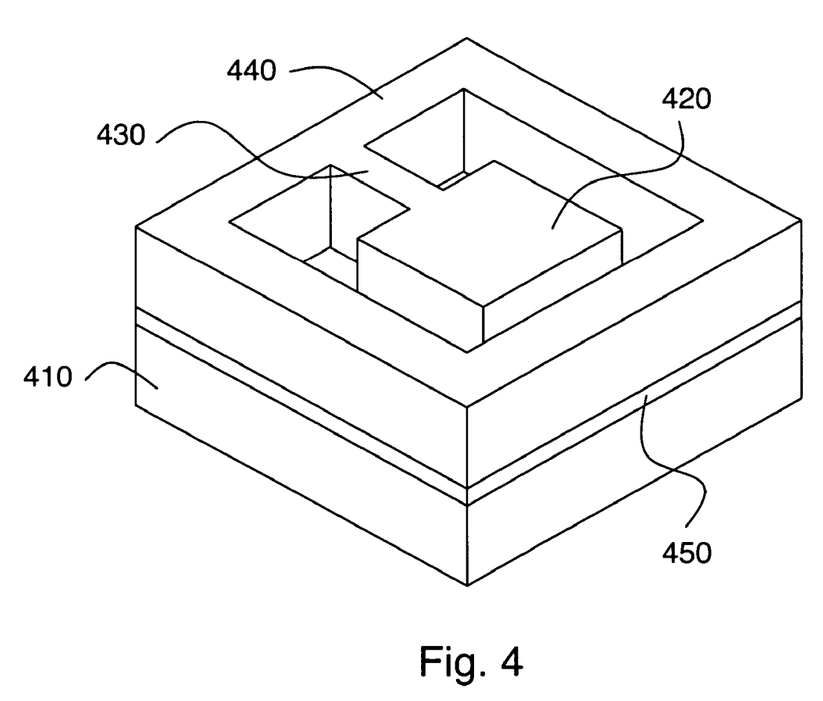
FIG. 4 shows a portion of a MEMS sensor according to an embodiment of the invention in a perspective view.

FIG. 4 shows a perspective view of a portion of a MEMS sensor according to the invention. A frame 440 is positioned above a base 410. A proof mass 420 is disposed within frame 440 and is connected to frame 440 with a flexure 430. Acceleration imparted to frame 440 causes relative motion between frame 440 and proof mass 420. Sensing of this relative motion provides sensing of the acceleration imparted to frame 440. Typically, a sacrificial layer 450 is positioned in between frame 440 and base 410. During processing, part of sacrificial layer 450 is removed in order to release proof mass 420 and flexure 430 from base 410, thereby permitting motion of proof mass 420 and flexure 430.

Figure 5:
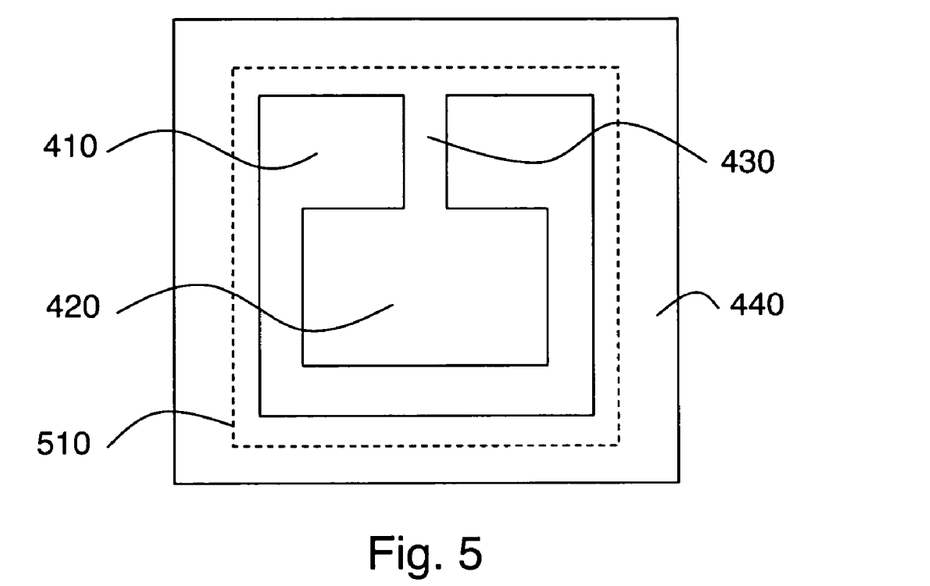
FIG. 5 shows a top view of the sensor of FIG. 4.

FIG. 5 shows a top view of the accelerometer of FIG. 4. Within line 510, sacrificial layer 450 (on FIG. 4) has been removed. Thus there is a gap between proof mass 420 and base 410 (and between flexure 430 and base 410) which allows motion of proof mass 420 and flexure 430 responsive to acceleration to be sensed. Sensing such motion of proof mass 420 is preferably performed piezoresistively, as further discussed in connection with FIG. 9. For example, as shown on FIG. 6, piezoresistive sensing elements 610 can be positioned on the sides of flexure 430. As proof mass 420 moves from side to side on FIG. 6, flexure 430 bends accordingly, placing piezoresistive sensing elements 610 under tension or compression which changes their resistance.

FIGS. 7a–7i show a preferred sequence of processing steps for fabricating a sensor according to an embodiment of the invention. This preferred processing sequence begins with a Silicon-On-Insulator (SOI) wafer having a base 710, an n-type silicon top layer 711 and an oxide layer 712 separating base layer 710 from top layer 711, as shown on FIG. 7a. Top layer 711 is typically single-crystal silicon, although it can be poly-crystalline silicon for applications which do not require single-crystal silicon. Typical thicknesses for top layer 711 and oxide layer 712 are 20 microns and 2 microns respectively. Top layer 711 is patterned and etched in order to define elements of an accelerometer.

Figure 6:
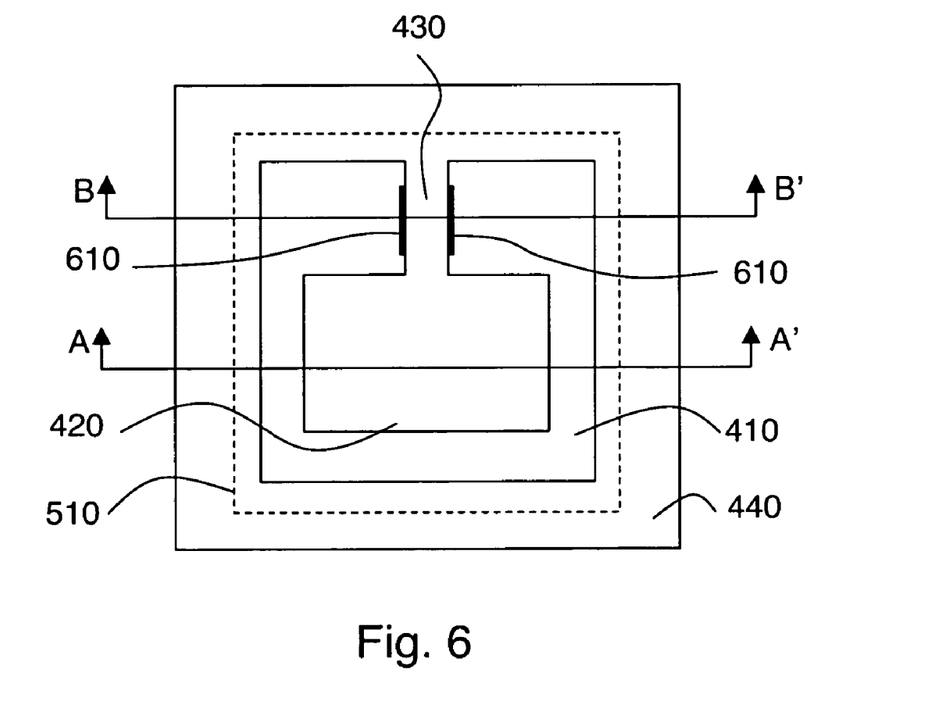
FIG. 6 shows suitable piezoresistive sensing element locations for a MEMS sensor according to an embodiment of the invention.
Figure 7A:
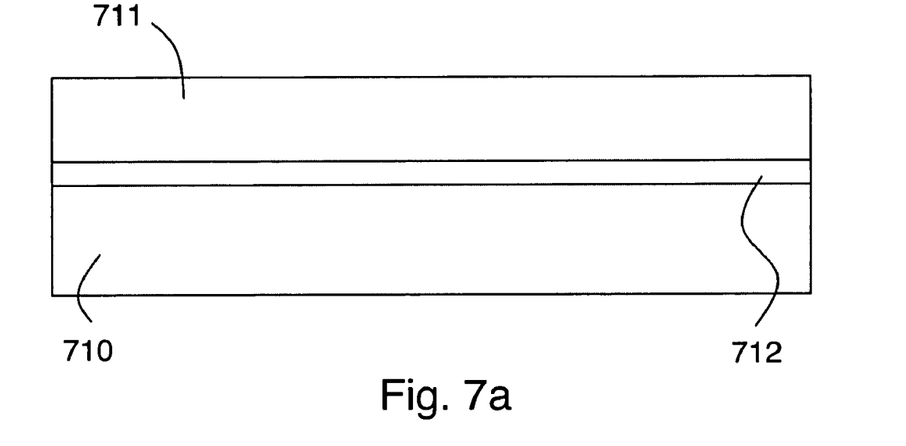
FIGS. 7a–7i show a preferred processing sequence for fabricating a MEMS sensor according to an embodiment of the invention.
Figure 7B:
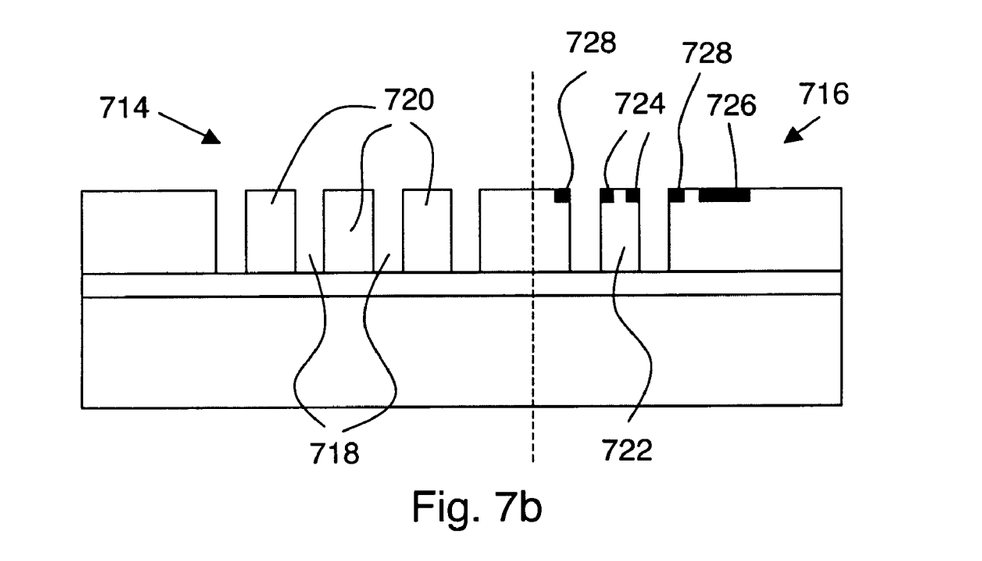

FIGS. 7b–7i show regions 714 and 716 corresponding to sections A–A' and B–B' respectively on FIG. 6. Thus region 714 on FIG. 7b shows a section through a proof mass 720 having holes 718 in it, and region 716 on FIG. 7b shows a section through a flexure 722 having p-type piezoresistive elements 724 on its edges. Holes 718 through proof mass 720 facilitate release of proof mass 720 from base 710, and are preferred but not required. These holes can be as small as about 1 micron in width, since release etching is preferably performed with a gas-phase process, as discussed below.

Piezoresistive elements 724 are preferably fabricated by sidewall ion implantation and annealing. Other methods can also be used to fabricate piezoresistive elements 724. For example, piezoresistive elements 724 can be formed by diffusion in a furnace containing boron nitride wafers, where an oxide or nitride mask is used to protect parts of the wafer that will not become piezoresistive elements 724. It is also possible to fabricate localized deposits of boron-doped glass on the wafer, and then heat the wafer in a furnace to diffuse boron from the glass into the wafer. Sidewall ion implantation is a preferred method because it provides improved uniformity, contacting, and process control compared to alternative approaches. Reference p-type resistive elements 728 on FIG. 7b are preferably included in sensors according to the invention, in order to provide a reference resistivity signal from a non-strained portion of the sensor. Such reference resistivity signals can be compared to signals provided by piezoresistive elements 724 in order to improve measurement accuracy. Also shown on FIG. 7b is a doped p-plus contact region 726 for making external electrical contact. Since elements 724, 726, and 728 are all p-type inclusions in an otherwise n-type layer, elements 724, 726, and 728 are electrically isolated from each other. Furthermore, p-type traces, which can be defined by ion implantation, can be used to route signals within the device layer (i.e., layer 711 on FIG. 7a).

Figure 7C:
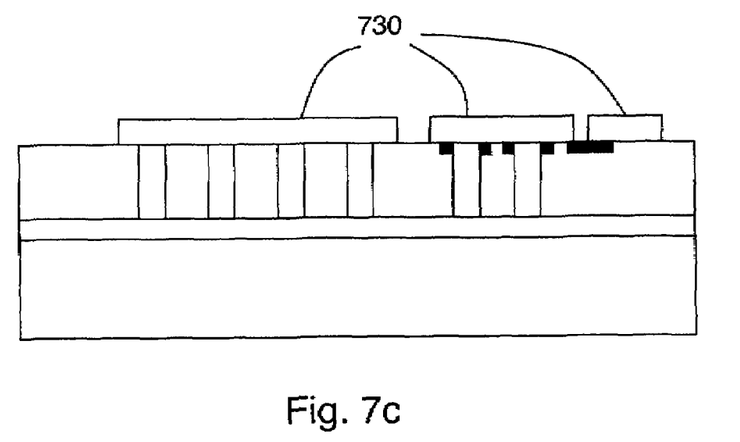

FIG. 7c shows the result of depositing and patterning an oxide layer 730 on top of the structure of FIG. 7b. Oxide layer 730 covers the movable elements of the accelerometer (i.e., proof mass 720 and flexure 722 on FIG. 7b). Oxide layer 730 is also patterned to provide isolation for contact region 726. Oxide layer 730 bridges the gaps in the structure it is grown on. In order to accomplish this bridging, growth is preferably non-conformal, such that deposition is most rapid on surfaces most exposed to a material source, and is less rapid on less exposed surfaces. Since the top surface (and side walls near the top surface) are relatively exposed surfaces, non-conformal growth is helpful for bridging the gaps. Methods for providing non-conformal oxide deposition are known for various deposition techniques. For example, deposition of a low temperature oxide in a low pressure chemical vapor deposition (CVD) system is typically non-conformal, and non-conformal deposition can also be obtained in evaporation, sputtering, and other CVD processes. Typically, the thickness of oxide layer 730 is comparable to or slightly larger than the gap to be bridged. For example, a 2 micron gap can be bridged by a 3–5 micron thick oxide layer.

Oxide layer 730 bridges holes 718 in proof mass 720, and also bridges the gap between the frame and the proof mass/flexure assembly. Thus in practice, the gap separating frame from proof mass and flexure is much smaller than shown on FIG. 4. We have found a gap of about 2 microns separating proof mass 420 and flexure 430 from frame 440 (all on FIG. 4) preferable in practice, since a 2 micron gap can be bridged by oxide 730, and having a small gap between the frame and the proof mass provides over travel protection by limiting flexure motion to within its elastic range. Furthermore, oxide 730 tends to crack when bridging of significantly larger gaps (i.e., about 5 micron gaps) is attempted. Holes 718 in proof mass 720 can be as small as about 1 micron in width, as indicated above, and can thus easily be bridged by oxide 730.

Figure 7D:
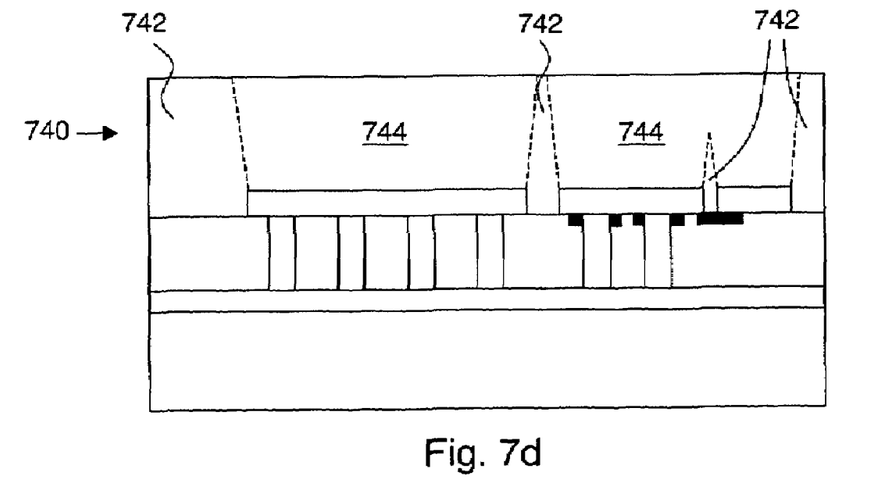

FIG. 7d shows the result of growth of a p-type silicon encapsulation layer 740 over the structure of FIG. 7c. The thickness of encapsulation layer 740 is typically from about 10 microns to about 40 microns. The deposition temperature of encapsulation layer 740 is preferably limited to less than about 1000 C in order to avoid diffusion within piezoresistive elements 724. Single-crystal silicon 742 forms in regions where growth commences on a silicon surface, and polycrystalline silicon 744 forms in regions where growth commences on an oxide surface. After deposition, encapsulation layer 740 can be planarized by chemical mechanical polishing CMP if necessary, to allow subsequent processing steps to begin on a planar surface.

Figure 7E:
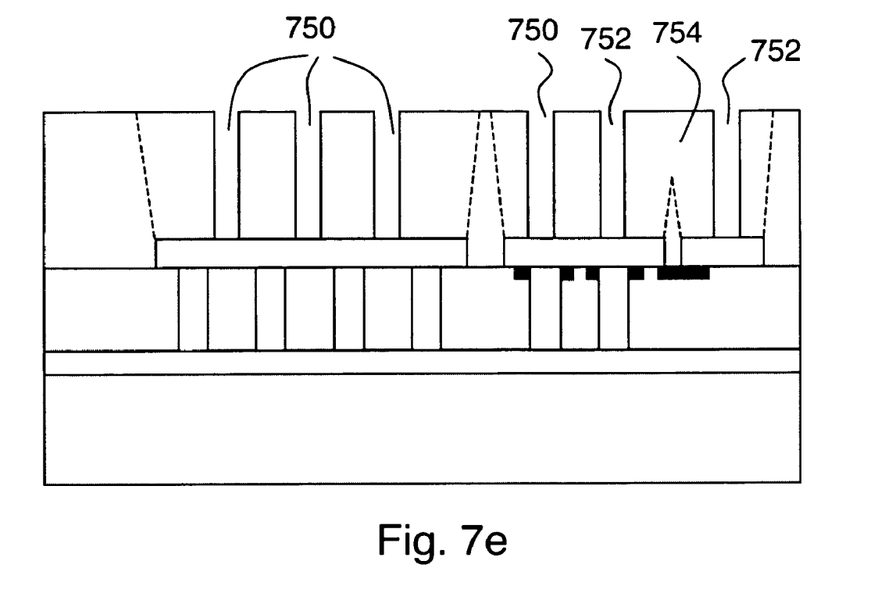

FIG. 7e shows the result of patterning and etching encapsulation layer 740 on FIG. 7d. Etch holes 750 and isolation trenches 752 are defined in this processing step. Etch holes 750 allow release etching of the accelerometer elements to be performed, while isolation trenches 752 provide electrical isolation of contact regions such as 754 on FIG. 7e from the rest of encapsulation layer 740. Deep reactive ion etching (DRIE) is a suitable etching technique for this processing step.

Figure 7F:
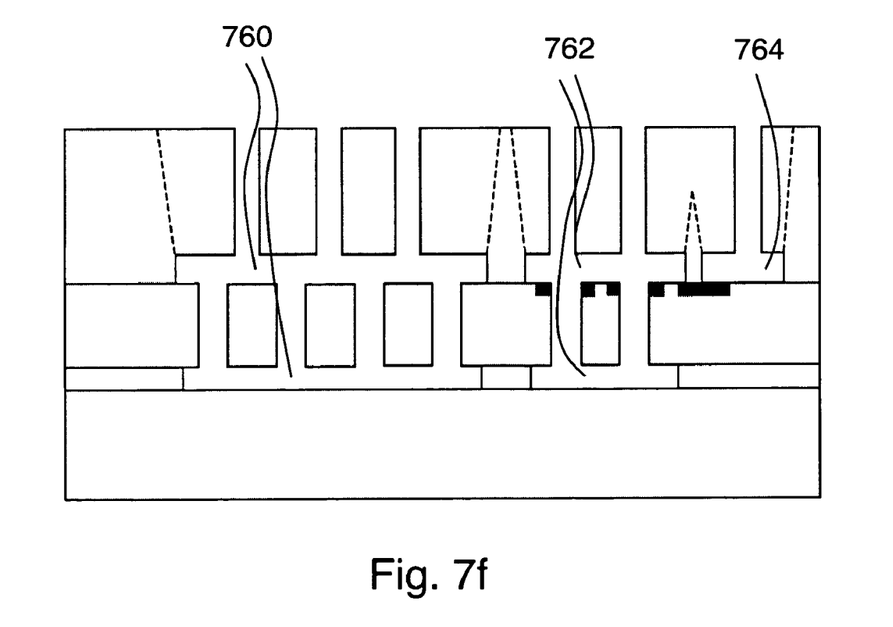

FIG. 7f shows the result of a vapor-HF etch applied to the structure of FIG. 7e. Patterned oxide layer 730 is removed in this step, as are portions of oxide layer 712 positioned below proof mass 720 and flexure 722. Thus release of proof mass 720 from base 710 and encapsulation layer 740 is accomplished by forming gaps 760, and release of flexure 722 from base 710 and encapsulation layer 740 is accomplished by forming gaps 762. Gap 764 electrically isolates contact region 754 from other parts of encapsulation layer 740. The lateral etch rate provided by the vapor-HF etch is about 20 microns/hour. Further information on this vapor-HF process is given in U.S. Pat. No. 5,683,591. Vapor-HF etching is preferred because it does not wet the surfaces of the accelerometer elements, and thereby avoids problems associated with surface tension and stiction that are often encountered when performing release etching with a liquid etchant. Also, a vapor-HF etchant can pass through much smaller holes than a liquid etchant can. Thus etch holes 750 on FIG. 7e can be as small as about 1 micron in width, which improves the mechanical strength of encapsulation layer 740.

Figure 7G:
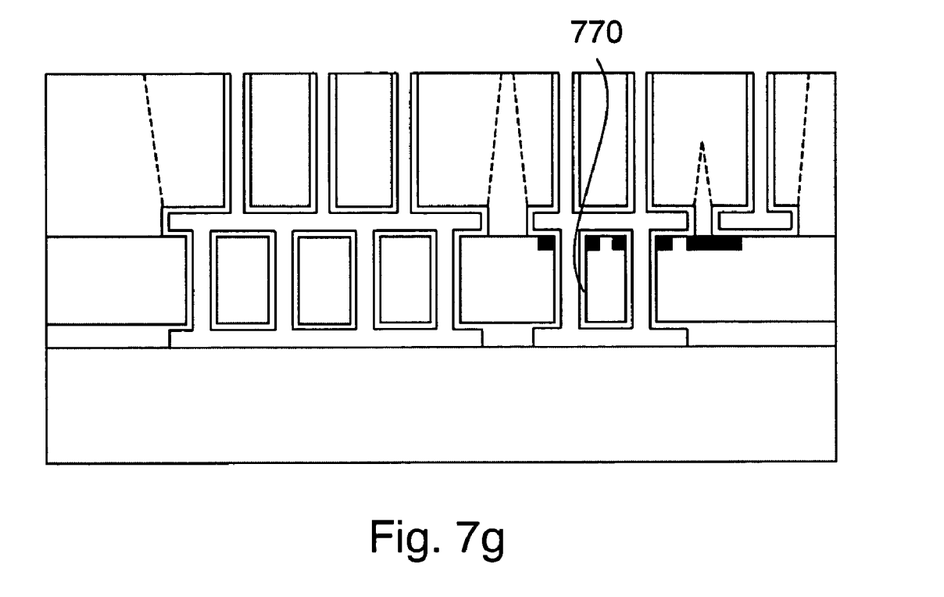

FIG. 7g shows the result of thermal oxidation of the structure of FIG. 7f. An oxide layer 770 is formed covering all exposed silicon surfaces in the structure of FIG. 7f. This can be done by heating the structure of FIG. 7f to a temperature of about 950 C in an atmosphere of $H_2O$ and $O_2$ for about 60 minutes or less. The purpose of oxide layer 770 is to passivate the exposed silicon surfaces on the accelerometer elements. We have found such passivation to be effective for reducing noise in piezoresistive sensing elements. Thus deposition of oxide layer 770 is preferred, but not required, in practicing the invention.

Figure 7H:
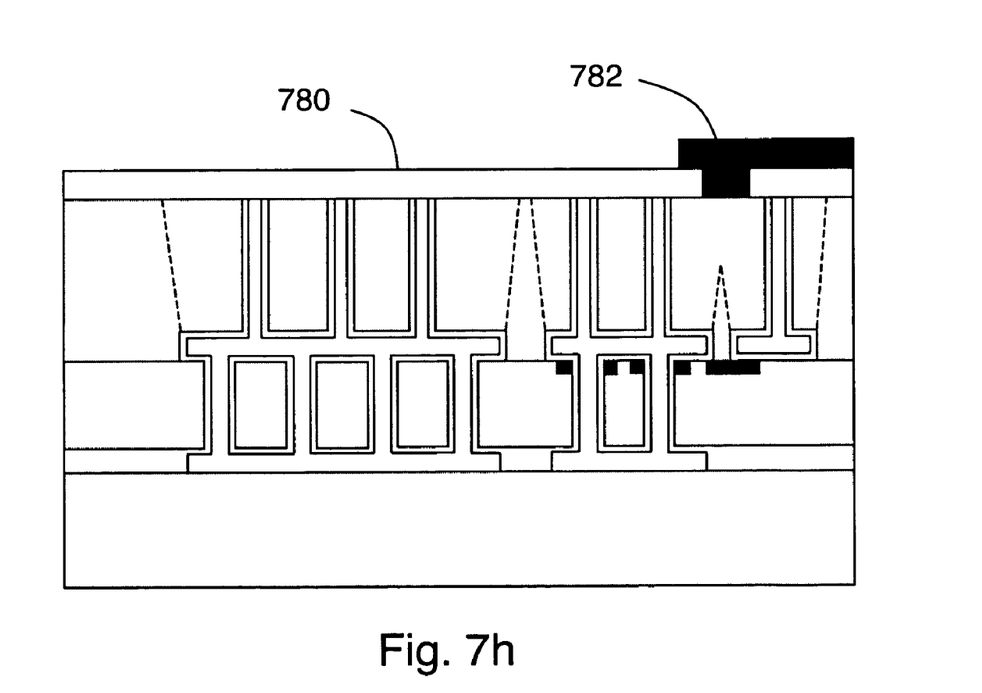

FIG. 7h shows the result of deposition of seal oxide 780 and aluminum bond pad 782 on the structure of FIG. 7g. Seal oxide 780 seals off etch holes 750 and isolation trenches 752, and it is also patterned to define contact points between contact regions 754 and bond pads 782, as shown. In the structure of FIG. 7h, the movable elements of the accelerometer are completely protected from environmental contamination. Therefore, further processing of the structure of FIG. 7h can be performed using conventional methods.

Figure 7I:
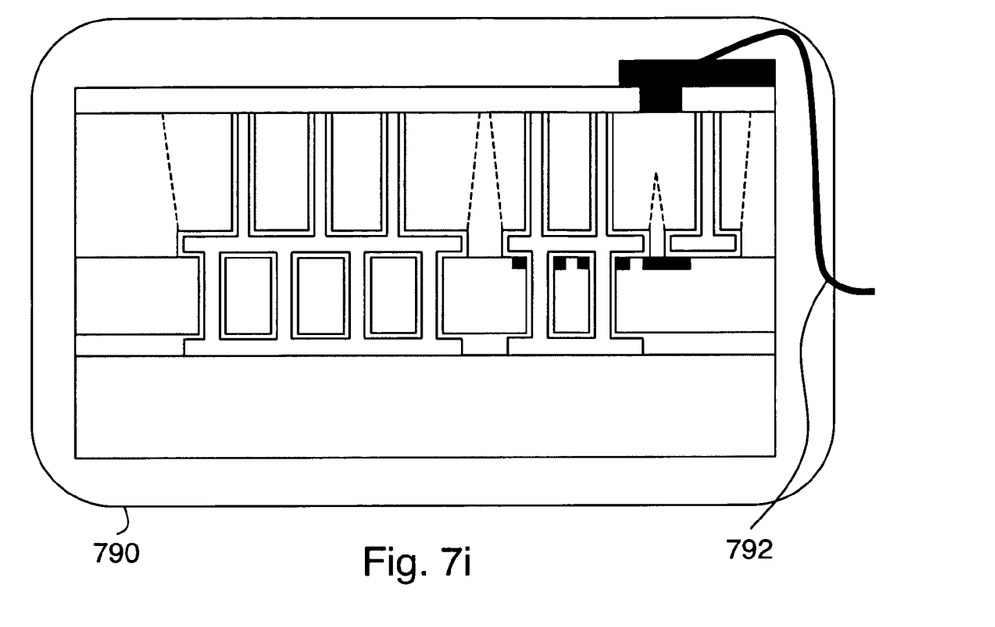

In particular, conventional device dicing and packaging methods can be applied to the structure of FIG. 7h to provide the packaged sensor of FIG. 7i. On FIG. 7i, a package 790, which can be fabricated with plastic injection chip packaging, surrounds a single accelerometer, and a wire 792 provides an external connection to bond pad 782 and ultimately to doped region 726 (on FIG. 7b). For simplicity, only one wire 792 is shown on FIG. 7i, although in practice, more than one external contact is typically made. We have found that encapsulation layer 740 can be designed to withstand a pressure of 100 atmospheres, which is an estimated peak pressure encountered during plastic injection chip packaging.

A key point of the processing sequence of FIGS. 7a–7i is that device encapsulation is almost entirely performed before releasing the flexure and proof mass. This sequence provides improved yield compared to conventional MEMS processing, since released mechanisms are always protected. This sequence also provides reduced device size compared to the conventional alternative of bonding a cap to the base at a late stage of processing. In the present approach, there is no need to allocate device real estate for such cap bonding.

Figure 8:
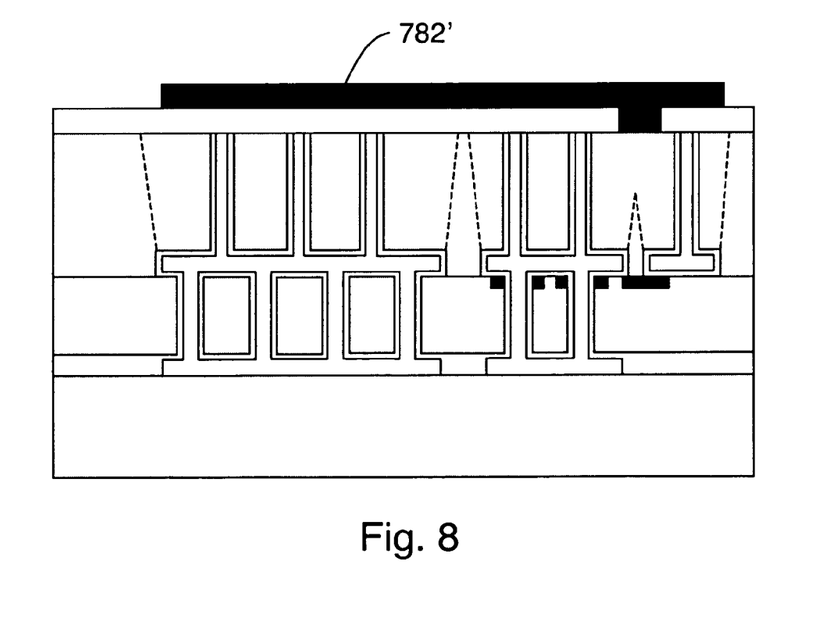
FIG. 8 shows an alternate bond pad configuration for a MEMS sensor according to an embodiment of the invention.

Note that the processing sequence of FIGS. 7a–7h has defined an electrically isolated vertical contact within encapsulation layer 740 between doped contact region 726 (on FIG. 7b) and bond pad 782 of FIG. 7h. Thus there is no need to route signals to the periphery of the device chip, which is also helpful in reducing device size. To further reduce device size, the configuration of FIG. 8 can be employed, where bond pad 782' is configured to be substantially laterally aligned with proof mass 720. By arranging at least one (and preferably all) bond pads in this manner, the device area devoted exclusively to bond pad area is decreased.

In other words, the proof mass area is useful since the mass of the proof mass, which scales with proof mass area, is one of the key parameters determining accelerometer performance. Area devoted exclusively to bond pads is comparatively useless. By positioning bond pads above and laterally aligned to the proof mass, the ratio of useful area to total (i.e., useful+useless) area is increased. Similar reasoning leads to a preference for proof masses having a substantially rectangular shape. Since conventional dicing processes provide rectangular chips, it is easiest to maximize the ratio of proof mass area to device area when the proof mass is also rectangular. It is also preferable to thin base 710 to a thickness of about 200 microns, which reduces device size while still providing sufficient mechanical strength. Preferably, this thinning is performed immediately prior to separation of the wafer into individual devices (e.g., by dicing), to minimize handling of a thinned wafer.

Preferably, piezoresistive sensing is employed in practicing the invention, mainly to provide low-noise remote sensing capability. The resistance of a piezoresistive element can be selected to be anywhere in a range from about 10 Ω to about 10 MΩ or more, by appropriately selecting doping and geometry of the piezoresistive element. The ability to adjust the resistance value of a piezoresistive element independent from its size is also important. The resistance of the piezoresistive element is determined by the dimensions of its doped region and by the doping density. As the element is miniaturized, the dimensions of the doped region will be reduced, but the resistance value can be maintained.

Specifically, the resistance is proportional to the length/(width*depth) and is inversely proportional to the doping density. If the length/width ratio is maintained, the resistance value can be maintained by keeping the doping density constant and the doping depth constant. If it is necessary to adjust the length/width ratio, the depth and density can be adjusted over a wide range to compensate. By selecting a piezoresistive element having a large resistance, power consumption during operation can be reduced, which is advantageous for applications which require limited power use, such as a sensor operated by a pacemaker.

Alternatively, the use of piezoresistive sensing elements having relatively low resistance (e.g., on the order of 1 kΩ) offers other advantages, especially the ability to perform low-noise remote sensing. This advantage can be appreciated in connection with FIG. 9, which shows remote piezoresistive sensing in accordance with an embodiment of the invention.

Figure 9:
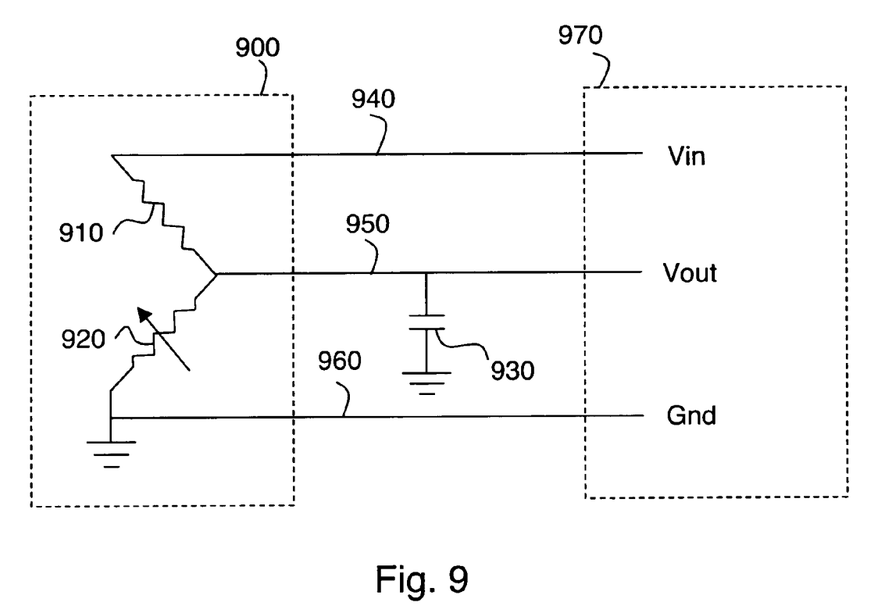
FIG. 9 shows remote piezoresistive sensing according to an embodiment of the invention.

FIG. 9 shows a sensor head 900 containing a reference resistor 910 and a piezoresistive element 920. Sensor head 900 is connected to remotely disposed circuitry 970 via wires, or other electrical connections, 940, 950, and 960. Application of a voltage Vin between wire 940 and wire 960 leads to the generation of a voltage Vout between wire 950 and wire 960. Variation of the resistance of piezoresistive element 920, induced by motion of sensor head 900, causes a variation of Vout for a constant Vin, and this variation of Vout is the desired measurement signal. The configuration of FIG. 9 is especially appropriate in applications which require small sensor size, since sensor head 900 need not contain circuitry 970 and can therefore be reduced in size compared to a sensor head that includes active circuitry. Preferably, sensor head 900 is embedded within a sensor head package adapted for implantation into a desired location (e.g., middle ear, heart wall, etc.). Preferably such a sensor head package contains only passive electrical components - - - i.e., resistors (including piezoresistive elements), capacitors and/or inductors - - - and does not contain any active electrical elements (e.g., transistors or integrated circuits containing transistors), to minimize package size. Circuitry 970 typically includes power supply circuitry for providing power to sensor head 900 and sensing/signal conditioning circuitry for receiving signals from sensor head 900.

However, remote sensing as shown in FIG. 9 is subject to interference from currents induced on wires 940, 950, and/or 960 as a result of varying magnetic fields and/or capacitive pickup. These sources of noise are schematically shown as capacitor 930, and effectively generate a small current I across piezoresistive element 920. The voltage across piezoresistive element 920 is typically what is measured, as in FIG. 9, so the interference from the noise current I is proportional to the resistance R of piezoresistive element 920. Thus decreasing R advantageously decreases noise in the remote sensing arrangement of FIG. 9.

The ability to reduce noise in a remote sensing arrangement such as shown in FIG. 9 is an advantage of piezoresistive sensing. Capacitive sensors generally have very large (effective) values of R. For example, a typical capacitive sensor has a capacitance of 1 pF, and at 100 Hz, this effectively gives a resistance of 1 GΩ. Thus such a capacitive sensor is $10^6$ times more sensitive to noise current than a piezoresistive sensor having R=1 kΩ. For this reason, capacitive sensors are usually packaged with integrated active sense circuitry. Such integration of sense circuitry into the sensor head alleviates the above noise issue, but increases the size of the packaged sensor head.

Other sources of noise to consider include temperature noise, Johnson noise and thermomechanical noise. Piezoresistive elements tend to have a strong dependence of resistance on temperature (e.g., a 10 K change in temperature can cause a 20% change in resistance). For the biological applications of greatest interest here, the environment is well temperature-stabilized, and temperature noise is typically not an issue. Johnson noise contributes broadband noise having a power proportional to the resistance of piezoresistive element 920, and can therefore be decreased by selecting a relatively small resistance (such as on the order of 1 kΩ) for piezoresistive element 920. For typical devices having sensitivities of 1 mV/g, where g is the acceleration of gravity, the error due to Johnson noise is on the order of 1 μg, which is well below the environmental background and is thus negligible.

The thermomechanical noise spectral density is given by $$\text{thermo-mechanical noise equivalant acceleration} = \sqrt{\frac{4k_B T \omega_o}{m_p Q}},$$

where $k_B$ is Boltzmann's constant, T is absolute temperature, $\omega_o$ is resonant frequency, Q is damping factor and $m_p$ is the mass of the proof mass. A Silicon proof mass having dimensions of 1 mm×1 mm×10 μm has $m_p=10^{-8}$ kg, which gives a thermomechanical noise of 0.1 mg/√Hz assuming Q=1, T=300 K and a 1 kHz resonant frequency. Reduction of the proof mass area by a factor of 100 will increase noise by a factor of 10, which may be troublesome for some applications. The damping factor Q can be increased to 100 or more by establishing a partial (or nearly complete) vacuum within the encapsulation, in order to decrease drag on the moving proof mass. Also, the thickness of the proof mass can be increased, to at least 50 microns with the above process, in order to reduce noise by increasing $m_p$. Other approaches for noise reduction include operation at a lower resonant frequency (i.e., decreasing $\omega_o$) and/or narrowband filtering around the resonant frequency.

A miniature sensor head such as 900 on FIG. 9 can be embedded in a variety of packages, depending on the intended application. For example, one suitable package is the middle ear implant 350 of FIG. 3, and another suitable sensor head packages are shown on FIGS. 10–12.

Figure 10:
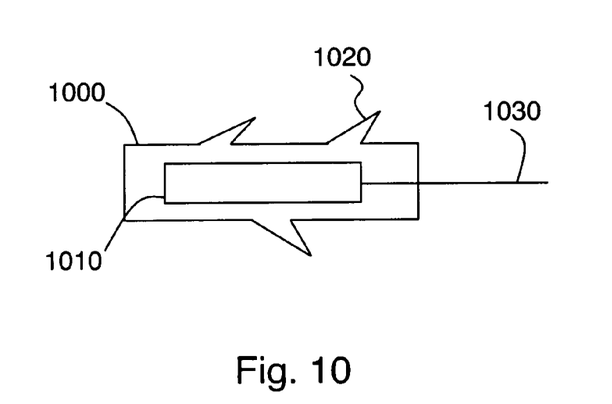
FIG. 10 shows a sensor head package in accordance with an embodiment of the invention.

FIG. 10 shows a sensor head package 1000 containing a sensor head 1010 remotely connected to active sense circuitry (not shown) via wire (or wires) 1030. Sensor head 1010 is preferably a piezoresistive sensor head similar to 900 on FIG. 9. Sensor head package 1000 includes barbs 1020 to facilitate implantation into biological tissue. Such a barbed sensor head can be guided to a desired location by a steerable catheter, pressed into contact with the tissue, and then remain lodged in the tissue for long-term continuous or intermittent measurements.

Figure 11:
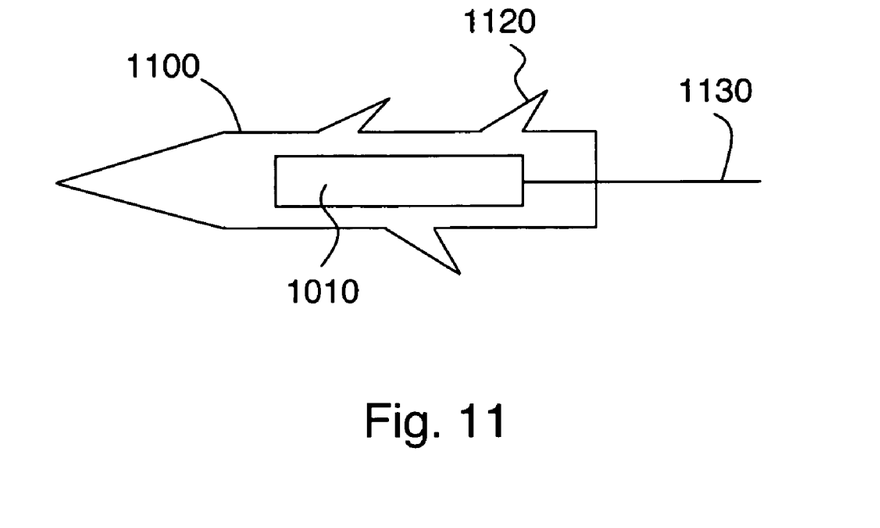
FIG. 11 shows a sensor head package in accordance with another embodiment of the invention.

FIG. 11 shows a sensor head package 1100 containing a sensor head 1010 remotely connected to active sense circuitry (not shown) via wire (or wires) 1130. Sensor head 1010 is preferably a piezoresistive sensor head similar to 900 on FIG. 9. Sensor head package 1100 includes barbs 1120 to facilitate implantation into biological tissue. The embodiment of FIG. 11 differs from that of FIG. 10 by provision of a sharp tip.

Figure 12:
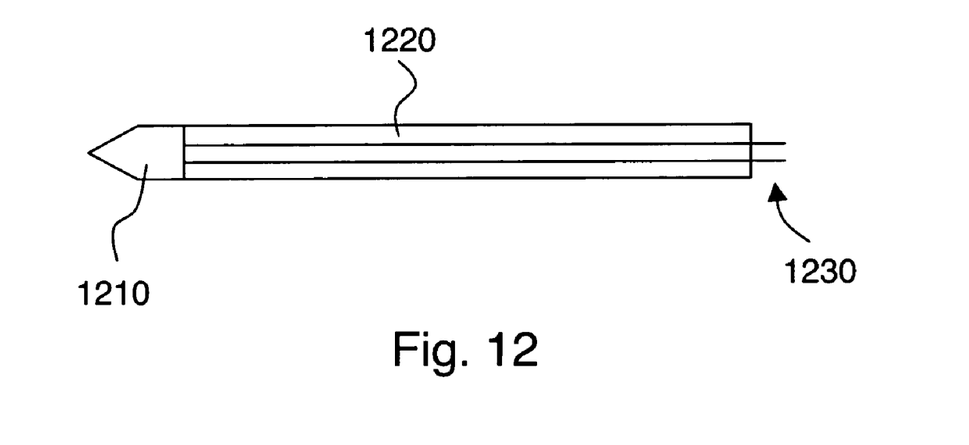
FIG. 12 shows a sensor head package in accordance with a further embodiment of the invention.

FIG. 12 shows an embodiment of the invention having a sensor head package 1210 disposed at an end of a thin flexible shaft 1220 such that the overall assembly is configured as a needle. Sensor head package 1210 preferably includes a piezoresistive sensor head similar to 900 on FIG. 9. Wires 1230 connect sensor head package 1210 to power and signal conditioning electronics (i.e., circuitry 970 on FIG. 9). Sensor head package 1210 and/or flexible shaft 1220 can include optional barbs (such as shown on FIGS. 10 and 11) to facilitate implantation into biological tissues. A miniaturized accelerometer at the tip of a needle has various applications, and can readily be inserted into specific internal biological structures (e.g., bones, tendons, muscles and/or organs) to sense their movement. In this embodiment, it is important that shaft 1220 be flexible, such that sensor head package 1210 moves with the structure it is implanted into without undue interference from shaft 1220.

The preceding detailed description of embodiments of the invention is intended to be illustrative rather than restrictive. Thus, the invention can also be practiced by varying many of the above given details. For example, n-type and p-type can be exchanged throughout the discussion in connection with FIGS. 7a–7i. Also, the preferred processing sequence of FIGS. 7a–7i provides electrically isolated vertical contacts (e.g., 754 on FIG. 7e) through encapsulation layer 740, which are preferred but not required to practice the invention.

The sensor head package of the present invention can be shaped as a replacement for a biomechanical element, such as an ossicular bone in the middle ear, or as any other mechanical element in any other biomechanical system. The human hearing system is a particular example where placement of an ultra small sensor at various locations provides many benefits. The present invention is also applicable to miniature inertial sensors for hearing, cardiovascular, skeletal, and neuro-muscular studies on small mammals. Such studies in small mammals, such as mice and rats, are important for developing prototype instruments and therapies prior to human trials. For these applications, provision of sensor head packages much smaller than 1 mm is crucial for enabling such studies to be performed.

What is claimed is:

1. A sensor comprising:
   a) a sensor head package containing a micromachined accelerometer comprising:
      i) a base layer;
      ii) a frame connected to and above said base layer;
      iii) a proof mass within said frame;
      iv) a flexure connecting said proof mass to said frame, said flexure including a piezoresistive element; and
      v) a silicon encapsulation layer above said frame, said proof mass and said flexure, wherein said proof mass and said flexure are released from said base layer and from said encapsulation layer after deposition of said encapsulation layer; and
   b) circuitry electrically connected to said piezoresistive element and remotely disposed from said sensor head package.

2. The sensor of claim 1, wherein a largest linear dimension of said sensor head package is less than about 0.5 mm.

3. The sensor of claim 1, wherein said sensor head package is configured for implantation into a middle ear.

4. The sensor of claim 3, wherein said sensor head package is configured as a replacement for one or more ossicular bones.

5. The sensor of claim 1, wherein said sensor head package includes a barb.

6. The sensor of claim 1, wherein said sensor head package has a pointed tip.

7. The sensor of claim 6, further comprising a flexible needle shaft having an end affixed to a surface of said sensor head package facing away from said pointed tip.

8. The sensor of claim 7, further comprising at least one wire running along said shaft and connecting said sensor head package to said circuitry.

9. The sensor of claim 1, further comprising a passivation layer disposed on said piezoresistive element.

10. The sensor of claim 1, wherein said flexure is coated with a passivation layer.

11. The sensor of claim 1, wherein said proof mass is substantially rectangular.

12. The sensor of claim 1, further comprising a bond pad disposed on top of said encapsulation layer and substantially laterally aligned with said proof mass.

13. The sensor of claim 1, wherein a gap separating said proof mass from said frame is about 2 microns.

14. The sensor of claim 1, wherein said base layer has a thickness of about 200 microns.

15. The sensor of claim 1, wherein said proof mass includes holes.

16. The sensor of claim 1, further comprising an electrically isolated vertical contact within said encapsulation layer.

17. The sensor of claim 1, wherein said sensor head package does not include any electrical circuit element other than a resistor, a capacitor, or an inductor.

* * * * *